US011892343B2

(12) United States Patent
Xu et al.

(10) Patent No.: US 11,892,343 B2
(45) Date of Patent: Feb. 6, 2024

(54) VIBRATION SENSOR

(71) Applicant: Shenzhen Fugui Precision Ind. Co., Ltd., Shenzhen (CN)

(72) Inventors: Peng Xu, Shenzhen (CN); Jian-She Feng, Shenzhen (CN); Chen-Yang Ma, Shenzhen (CN); Jian-Li Xu, Shenzhen (CN)

(73) Assignee: Shenzhen Fugui Precision Ind. Co., Ltd., Shenzhen (CN)

( * ) Notice: Subject to any disclaimer, the term of this patent is extended or adjusted under 35 U.S.C. 154(b) by 513 days.

(21) Appl. No.: 17/149,488

(22) Filed: Jan. 14, 2021

(65) Prior Publication Data

US 2022/0136892 A1 May 5, 2022

(30) Foreign Application Priority Data

Oct. 30, 2020 (CN) .......................... 202011193329.6

(51) Int. Cl.
*G01H 11/08* (2006.01)
*G01R 31/12* (2020.01)
(Continued)

(52) U.S. Cl.
CPC ............ *G01H 11/08* (2013.01); *G01R 31/12* (2013.01); *H10N 30/03* (2023.02); *H10N 30/87* (2023.02); *H10N 30/88* (2023.02)

(58) Field of Classification Search
CPC .. G01N 29/045; G01N 29/4454; G01N 29/14; G01N 29/46; G01H 11/08;
(Continued)

(56) References Cited

U.S. PATENT DOCUMENTS 4,459,850 A * 7/1984 Hyanova .............. G10K 11/004
73/703
5,365,937 A * 11/1994 Reeves .................. A61B 7/003
600/595
(Continued)

FOREIGN PATENT DOCUMENTS

CN 104307724 A 1/2015
CN 106025057 A 10/2016
(Continued)

OTHER PUBLICATIONS

English Translation for JP2012205184.*

*Primary Examiner* — Helen C Kwok
(74) *Attorney, Agent, or Firm* — ScienBiziP, P.C.

(57) ABSTRACT

An ultrasonic sensor, which is installed on a test device, includes a shell, one end is open, the other end is closed surface; a cover sheet, bonded to the open end of the shell; a copper foil, a lower surface of the copper foil is bonded to an inner bottom surface of the closed surface of the shell; a piezoelectric chip, a lower surface of the piezoelectric chip is bonded to a upper surface of the copper foil, and when the test device vibrates, the piezoelectric chip converts a vibration signal into a voltage response signal; a cable, a positive electrode is welded on a upper surface of the piezoelectric chip, and a negative electrode is welded on the upper surface of the copper foil, configured to connect to an external detection device and transmit the voltage response signal to the external detection device.

7 Claims, 5 Drawing Sheets

(51) Int. Cl.
*H10N 30/03* (2023.01)
*H10N 30/87* (2023.01)
*H10N 30/88* (2023.01)

(58) Field of Classification Search
CPC ........ G01H 9/008; H01N 30/87; H01N 30/88; H01N 30/03; H01N 31/12; G01R 31/12
See application file for complete search history.

(56) References Cited

U.S. PATENT DOCUMENTS

| | | | |
|---|---|---|---|
| 2003/0177813 A1* | 9/2003 | Sakamoto | G01N 29/222 |
| | | | 73/24.01 |
| 2007/0012111 A1* | 1/2007 | Kim | G01H 9/004 |
| | | | 73/632 |
| 2009/0049919 A1* | 2/2009 | Hills | G01N 29/02 |
| | | | 73/632 |
| 2015/0053009 A1* | 2/2015 | Yan | G01N 29/46 |
| | | | 73/598 |
| 2015/0300894 A1* | 10/2015 | Robutel | G01N 29/036 |
| | | | 310/323.21 |
| 2020/0141794 A1* | 5/2020 | Hiyama | G10K 11/02 |
| 2020/0191647 A1 | 6/2020 | Yongzhong et al. | |
| 2022/0307896 A1* | 9/2022 | Buchfink | B06B 1/0644 |
| 2023/0037018 A1* | 2/2023 | Nagareda | B06B 3/00 |

FOREIGN PATENT DOCUMENTS

| | | | |
|---|---|---|---|
| CN | 207689437 | | 8/2018 |
| CN | 209459893 U | | 10/2019 |
| JP | 2002-043359 | * | 2/2002 |
| JP | 2012-205184 | * | 10/2012 |
| TW | 200532171 A | | 10/2005 |

\* cited by examiner

VIBRATION SENSOR

CROSS-REFERENCE TO RELATED APPLICATIONS

This application claims priority to Chinese Patent Application No. 202011193329.6 filed on Oct. 30, 2020, the contents of which are incorporated by reference herein.

FIELD

The subject matter herein generally relates to the field of sensors, and particularly to an ultrasonic sensor.

BACKGROUND

In industrial production, abnormalities in production equipment, such as punching equipment, often occur, which may cause abnormal product batches and interrupt production. Therefore, it is necessary to monitor the long-term vibration parameters of the production equipment, so as to predict the production interruption caused by the abnormal equipment during the production process.

BRIEF DESCRIPTION OF THE DRAWINGS

Implementations of the present technology will now be described, by way of example only, with reference to the attached figures.

DETAILED DESCRIPTION

Figure 1:
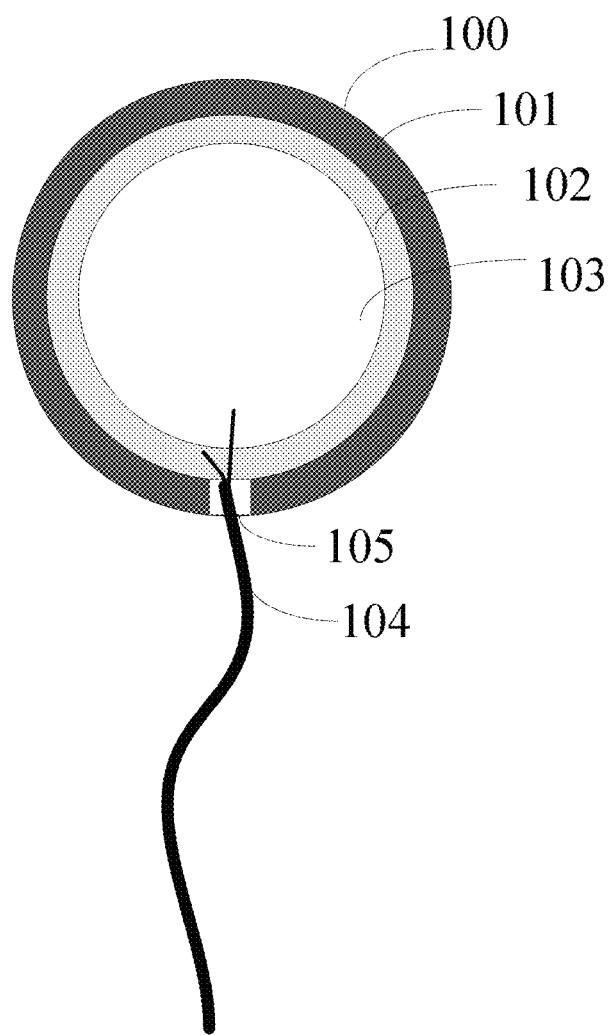
FIG. 1 is a schematic structural diagram of an embodiment of an ultrasonic sensor of the present invention.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. Also, the description is not to be considered as limiting the scope of the embodiments described herein. The drawings are not necessarily to scale and the proportions of certain parts have been exaggerated to better illustrate details and features of the present disclosure. The disclosure is illustrated by way of example and not by way of limitation in the figures of the accompanying drawings, in which like references indicate similar elements. It should be noted that references to "an" or "one" embodiment in this disclosure are not necessarily to the same embodiment, and such references mean at least one.

Several definitions that apply throughout this disclosure will now be presented.

The term "coupled" is defined as connected, whether directly or indirectly through intervening components, and is not necessarily limited to physical connections. The connection can be such that the objects are permanently connected or releasably connected. The term "comprising," when utilized, means "including, but not necessarily limited to"; it specifically indicates open-ended inclusion or membership in the so-described combination, group, series, and the like.

FIG. 1 illustrates schematic structural diagram of an embodiment of an ultrasonic sensor 10 of the present invention. In at least one embodiment, the ultrasonic sensor 10 includes a shell 100, a cover sheet 101, a copper foil 102, a piezoelectric chip 103 and a cable 104. The ultrasonic sensor 10 is installed on a test device to detect a vibration signal of the test device and convert the vibration signal into a voltage response signal.

In at least one embodiment, one end of the shell 100 is open, and the other end of the shell 100 is closed surface. The closed surface includes an inner bottom surface. The cover sheet 101 is matched with the open end of the shell 100 and bonded to the open end of the shell 100. The copper foil 102 includes an upper surface and a lower surface, and the lower surface of the copper foil 102 is bonded to the inner bottom surface of the closed surface of the shell 100. The piezoelectric chip 103 includes an upper surface and a lower surface, and the lower surface of the piezoelectric chip 103 is bonded to the upper surface of the copper foil 102. When the test device vibrates, the piezoelectric chip 103 converts the vibration signal into a voltage response signal. In at least one embodiment, the piezoelectric chip 103 is a ceramic chip. The cable 104 includes a positive electrode and a negative electrode. The positive electrode of the cable 104 is welded on the upper surface of the piezoelectric chip 103, and the negative electrode of the cable 104 is welded on the upper surface of the copper foil 102. The cable 104 is configured to connect to an external detection device and transmit the voltage response signal to the external detection device. The external detection device may be, but is not limited to, an oscilloscope, a network analyzer and other detection devices. When the test device continues to work, the cable 104 outputs a continuous voltage response signal curve. When the voltage response curve deviates from a monitoring envelope curve range, the test device works abnormally.

In at least one embodiment, the shell 100 includes a groove 105 configured to lead out the cable 104.

In at least embodiment, the ultrasonic sensor 10 further includes a lead block (not shown in figure) arranged between the piezoelectric chip 103 and the cover sheet 101. The lead block is configured to amplify the voltage response signal.

In at least one embodiment, the test device is described by taking a punching device as an example. The vibration signal generated by the punching device during working process is mainly divided into two situations: a vertical acceleration signal is the main component and an acoustic emission signal at the moment of the punching is the main component. When the component of the vibration signal is mainly the vertical acceleration signal, the punching device uses the ultrasonic sensor 10 to respond to the voltage of the vibration signal perpendicular to the thickness direction to reflect the punching signal. The lead block is arranged on the ultrasonic sensor 10 so that the lead block can apply force to the ultrasonic sensor 10 to amplify the voltage response signal of the ultrasonic sensor 10 during punching. The larger the lead block, the larger the voltage response signal of the piezoelectric chip 103, and the higher the frequency, the larger the voltage response signal of the piezoelectric chip 103.

When the component of the vibration signal is mainly the acoustic emission signal, the smaller the lead block, the larger the voltage response signal of the piezoelectric chip 103. Therefore, when the vibration signal generated during the punching process is mainly composed of the acoustic signal at the moment of the punching, the piezoelectric chip 103 responds optimally without the lead block. Therefore, in practical applications, the ultrasonic sensor 10 can be selected to add or not add lead blocks according to different application scenarios.

Figure 2:
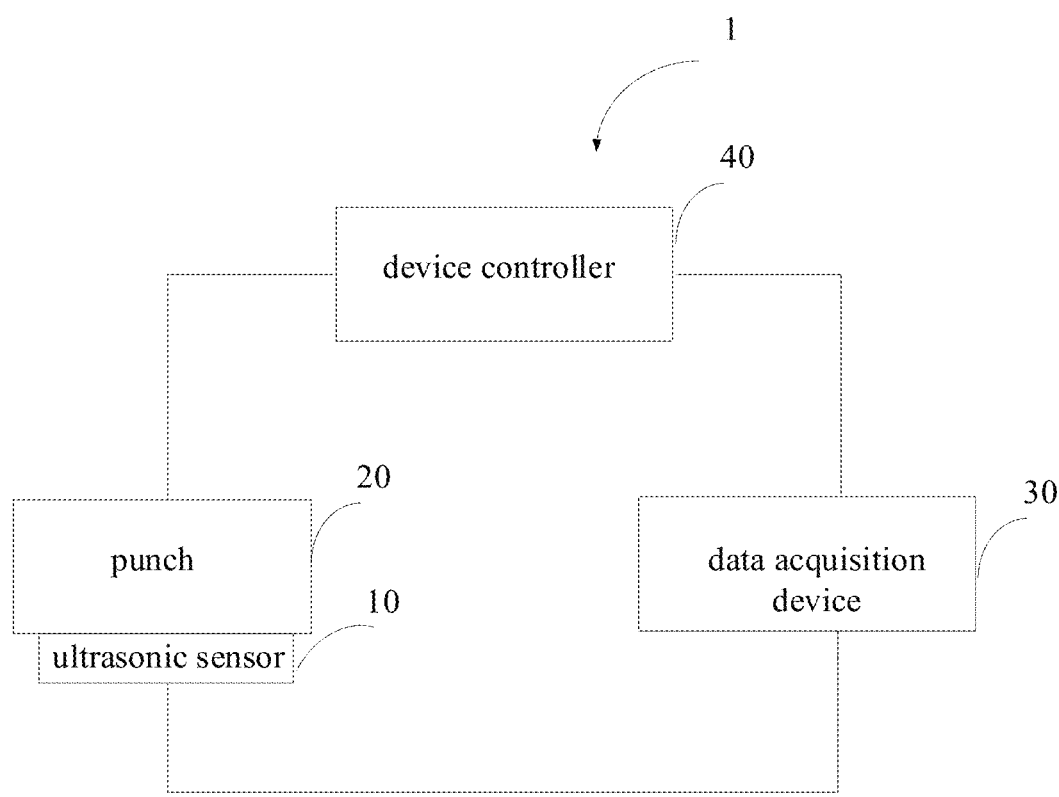
FIG. 2 is 2 is a schematic diagram of modules of an embodiment of the punching abnormality detection system of the present invention.

Referring to FIG. 2, FIG. 2 is a schematic diagram of modules of an embodiment of the punching abnormality detection system 1 of the present invention. In at least one embodiment, the punching abnormality detection system 1 includes the ultrasonic sensor 10, a punch 20, and a data acquisition device 30.

In at least one embodiment, the punch 20 includes upper mould and lower mould, and during operation, vibration signals are generated when the upper mould and lower mould impact. The ultrasonic sensor 10 is fixed on the punch 20 and is configured to convert the vibration signal generated by the punch 20 into the voltage response signal. The data acquisition device 30, electrically connected to the ultrasonic sensor 10, is configured to collect the voltage response signal in real time, generate a monitoring envelope curve, and analyze whether the voltage response curve deviates from the monitoring envelope curve. When the voltage response curve exceeds the monitoring envelope curve, it is determined that the punch 20 works abnormally, and an abnormal signal is output.

Figure 3:
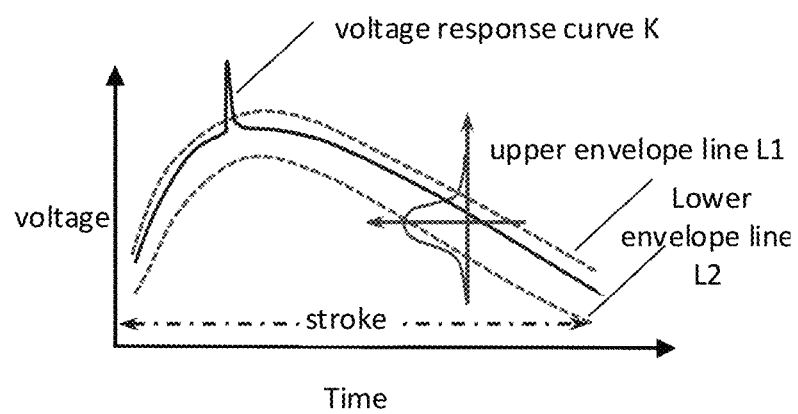
FIG. 3 is a schematic diagram of the monitoring envelope curve of the present invention.

Referring to FIG. 3, FIG. 3 is a schematic diagram of the monitoring envelope curve of the present invention. As shown in FIG. 3, the monitoring envelope curve L includes an upper envelope line L1 and a lower envelope line L2. When the voltage response curve K is between the upper envelope line L1 and the lower envelope line L2, the punch 20 works normally. When the voltage response curve K deviates from the upper envelope line L1, the data acquisition device 30 outputs a first abnormal signal, and when the voltage response curve deviates from the lower envelope L2, the data acquisition device 30 outputs a second abnormal signal.

In at least one embodiment, punching abnormality detection system 1 further includes a device controller 40. The device controller 40 is electrically connected to the punch 20 and the data acquisition device 30, and is configured to control the punch 20 to stop working when the first abnormal signal is received send out an alarm when the second abnormal signal is received. Specifically, when the voltage response curve K deviates from the lower envelope curve, the punching product has defects and quality problems; when the voltage response curve K deviates from the upper envelope curve, it indicates that a major failure that endangers the punch 20 or punch mould has occurred, then the equipment controller 40 controls the punch 20 to stop working. As shown in FIG. 3, the voltage response curve K deviates from the upper envelope L1, at this time, the device controller 40 controls the punch 20 to stop working.

In at least one embodiment, the data acquisition device 30 uses the AI algorithm to generate the monitoring envelope curve according to the voltage response signal. Specifically, the data acquisition device 30 first extracts the effective signal of the voltage response signal; then performs high-frequency removal processing on the effective signal to generate a high-frequency signal; further, extracts time domain features and frequency domain features from the de-high frequency signal; finally, generates the monitoring envelope curve according to the extracted time domain features and frequency domain features. In practical applications, the punching abnormality detection system 1 usually includes a plurality of ultrasonic sensors 10 to realize multi-angle data acquisition.

Figure 4:
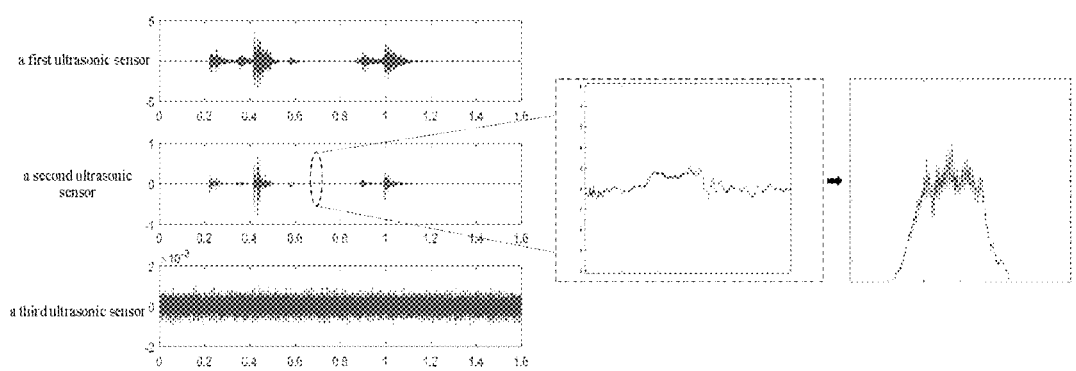
FIG. 4 is a schematic diagram of a data acquisition device extracting effective signals of the voltage response signal of the present invention.

Referring to FIG. 4, FIG. 4 is a schematic diagram of a data acquisition device extracting effective signals of the voltage response signal of the present invention. Taking three ultrasonic sensors 10 as an example. When the punch 20 completes a stroke, the corresponding angle of the electronic cam is 0~360°. During the punching process, the corresponding electronic cam angle of the upper mould and lower mould is 167~170°, at this time, an effective signal of impact appears in the second ultrasonic sensor 10. After all the signals of the second ultrasonic sensor 10 are windowed, the effective signal in this part of the dashed frame is extracted for high frequency removal processing.

Figure 5:
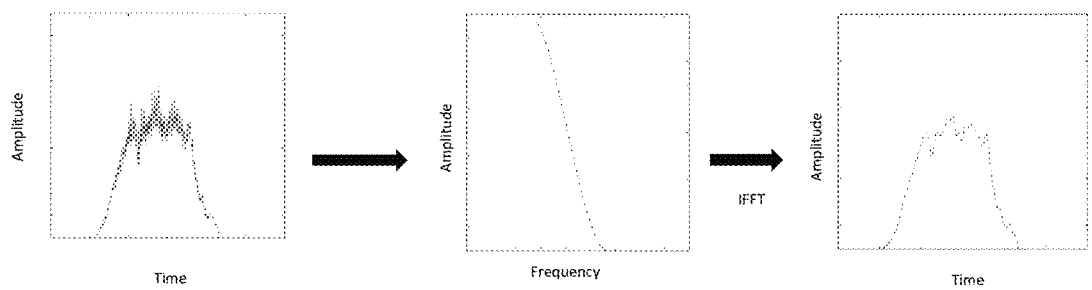
FIG. 5 is a schematic diagram of the data acquisition device performing high frequency removal processing on effective signals of the present invention.

As shown in FIG. 5, FIG. 5 is a schematic diagram of the data acquisition device performing high frequency removal processing on effective signals of the present invention. As shown in FIG. 5, the effective signal has more glitches, i.e. high frequency component. In order to better display the result, the data acquisition device 30 is further configured to transform the effective signal from time domain to Fourier transform and multiply by a window that only retains signals below 1 kHz in frequency domain, and then perform inverse Fourier transform to turn back time domain signal to generate the de-high frequency signal.

Compared with the prior art, the ultrasonic sensor and punching abnormality detection system provided by the embodiments of the present invention monitor the long-term vibration parameters of the production equipment through the ultrasonic sensor, thereby predicting production interruption caused by equipment abnormality during the production process and improving production quality.

Many details are often found in the art such as the other features of mobile terminal. Therefore, many such details are neither shown nor described. Even though numerous characteristics and advantages of the present technology have been set forth in the foregoing description, together with details of the structure and function of the present disclosure, the disclosure is illustrative only, and changes may be made in the detail, especially in matters of shape, size, and arrangement of the parts within the principles of the present disclosure, up to and including the full extent established by the broad general meaning of the terms used in the claims. It will therefore be appreciated that the embodiments described above may be modified within the scope of the claims.

What is claimed is:

1. A vibration sensor, which is installed on a test device, comprising:
   a shell, one end is open, the other end is closed surface;
   a cover sheet, bonded to the open end of the shell;
   a copper foil, a lower surface of the copper foil is bonded to an inner bottom surface of the closed surface of the shell;
   a piezoelectric chip, a lower surface of the piezoelectric chip is bonded to an upper surface of the copper foil, and when the test device vibrates, the piezoelectric chip converts a vibration signal into a voltage response signal;

a cable, a positive electrode is welded on an upper surface of the piezoelectric chip, and a negative electrode is welded on the upper surface of the copper foil, configured to connect to an external detection device and transmit the voltage response signal to the external detection device; and a lead block, arranged between the piezoelectric chip and the cover sheet, and configured to amplify the voltage response signal.

2. The vibration sensor of claim 1, wherein the cover sheet comprises a groove configured to lead out the cable.

3. The vibration sensor of claim 1, wherein the piezoelectric chip is a ceramic chip.

4. The vibration sensor of claim 1, wherein when a component of the vibration signal is mainly a vertical acceleration signal, the larger the lead block, the larger the voltage response signal.

5. The vibration sensor of claim 1, wherein when a component of the vibration signal is mainly an acoustic emission signal, the smaller the lead block, the larger the voltage response signal.

6. The vibration sensor of claim 1, wherein when the test device continues to work, the cable outputs a continuous voltage response signal curve.

7. The vibration sensor of claim 6, when the continuous voltage response signal curve deviates from a monitoring envelope curve range, the test device works abnormally.

* * * * *